United States Patent
Chen et al.

(10) Patent No.: US 11,024,750 B2
(45) Date of Patent: Jun. 1, 2021

(54) QUANTUM CAPACITANCE GRAPHENE VARACTORS AND FABRICATION METHODS

(71) Applicant: INTERNATIONAL BUSINESS MACHINES CORPORATION, Armonk, NY (US)

(72) Inventors: Zhihong Chen, West Lafayette, NY (US); Shu-Jen Han, Cortlandt Manor, NY (US); Siyuranga O. Koswatta, Carmel, NY (US); Alberto Valdes Garcia, Hartsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/571,940

(22) Filed: Sep. 16, 2019

(65) Prior Publication Data
US 2020/0014825 A1  Jan. 9, 2020

Related U.S. Application Data

(62) Division of application No. 15/840,354, filed on Dec. 13, 2017, now Pat. No. 10,636,917, which is a
(Continued)

(51) Int. Cl.
*H01L 29/93* (2006.01)
*B82Y 10/00* (2011.01)
(Continued)

(52) U.S. Cl.
CPC .............. *H01L 29/93* (2013.01); *B82Y 10/00* (2013.01); *H01L 28/40* (2013.01);
(Continued)

(58) Field of Classification Search
CPC .............. H01L 29/66174; H01L 29/93; H01L 29/6603; H01L 29/1606; H01L 29/66015; H01L 27/0808; H01L 2924/12034
See application file for complete search history.

(56) References Cited

U.S. PATENT DOCUMENTS

| 4,642,580 A | 2/1987 | Scott |
| 5,640,042 A | 6/1997 | Koscica et al. |

(Continued)

FOREIGN PATENT DOCUMENTS

JP  2006310590 A  11/2006

OTHER PUBLICATIONS

Dong, X., et al. "Electrophoresis of Graphene Sheets Into Porous Template for High Energy Density Supercapacitor" IP.com Prior Art Database. Apr. 2011. pp. 1-2. http://ip.com/IPCOM/000205699.
(Continued)

*Primary Examiner* — Laura M Menz
*Assistant Examiner* — Candice Chan
(74) *Attorney, Agent, or Firm* — Tutunjian & Bitetto, P.C.; Daniel P. Morris

(57) ABSTRACT

A plate varactor includes a dielectric substrate and a first electrode embedded in a surface of the substrate. A capacitor dielectric layer is disposed over the first electrode, and a layer of graphene is formed over the dielectric layer to contribute a quantum capacitance component to the dielectric layer. An upper electrode is formed on the layer of graphene. Other embodiments and methods for fabrication are also included.

17 Claims, 6 Drawing Sheets

Related U.S. Application Data division of application No. 13/291,596, filed on Nov. 8, 2011, now Pat. No. 9,893,212.

(51) Int. Cl.
  *H01L 49/02* (2006.01)
  *H01L 29/66* (2006.01)
  *H01L 29/16* (2006.01)
  *B82Y 40/00* (2011.01)

(52) U.S. Cl.
  CPC ...... *H01L 29/1606* (2013.01); *H01L 29/6603* (2013.01); *B82Y 40/00* (2013.01); *H01L 2924/12034* (2013.01)

(56) References Cited

U.S. PATENT DOCUMENTS

| | | | |
|---|---|---|---|
| 6,172,378 | B1 | 1/2001 | Hull et al. |
| 6,331,716 | B1 | 12/2001 | Kano |
| 6,407,412 | B1 | 6/2002 | Iniewski et al. |
| 6,521,939 | B1 | 2/2003 | Yeo et al. |
| 8,445,893 | B2 | 5/2013 | Meric et al. |
| 2008/0191196 | A1* | 8/2008 | Lu .................. H01L 29/165 257/27 |
| 2009/0001518 | A1 | 1/2009 | Kearney |
| 2010/0090759 | A1 | 4/2010 | Shin et al. |
| 2010/0265003 | A1 | 10/2010 | Schmidhammer |
| 2011/0003453 | A1 | 1/2011 | Jang |
| 2011/0018539 | A1 | 1/2011 | Viswanathan |
| 2011/0059599 | A1 | 3/2011 | Ward et al. |
| 2011/0260293 | A1 | 10/2011 | Narita |
| 2011/0309336 | A1* | 12/2011 | Shin .................. H01L 21/28255 257/29 |
| 2012/0146743 | A1 | 6/2012 | Ermolov |

OTHER PUBLICATIONS

Ek-Weis, J., et al. "Radio-Frequency Characterization of Varactors Based on Carbon Nanotube Arrays" Proceedings of the Institution of Mechanical Engineers, Part N: Journal of Nanoengineering and Nanosystems. Sep. 2008. pp. 111-115.

Koester, S. "Grapheme Quantum Capacitance Varactors for Wireless Sensing Applications" Device Research Conference. 2011 IEEE. Jun. 2011. pp. 43-44.

Nayfed, O., et al. "Graphene-Based Nanoelectronics" Army Research Laboratory, ARL-TR-5451. Feb. 2011. (46 Pages).

Office Action issued in U.S. Appl. No. 14/720,370 dated Jan. 19, 2016.

Office Action issued in U.S. Appl. No. 14/720,370 dated Aug. 15, 2016.

List of IBM Patents or Patent Applications Treated as Related dated Sep. 16, 2019, 2 pages.

* cited by examiner

QUANTUM CAPACITANCE GRAPHENE VARACTORS AND FABRICATION METHODS

BACKGROUND

Technical Field

The present invention relates to devices with variable capacitance (varactors), and more particularly to varactors formed with graphene dielectric.

Description of the Related Art

Varactors in silicon technologies have a maximum $C_{max}/C_{min}$ ratio of 5. This limits the performance of circuits that require variable capacitance, e.g., voltage-controlled oscillators (VCOs). A varactor is an essential component of multiple digital, analog and mixed-signal integrated circuits (ICs). At mmWave frequencies latencies between passive and active components must be minimized. This typically requires closely integrated components (preferably in the same substrate) for optimum performance.

SUMMARY

A plate varactor includes a dielectric substrate and a first electrode embedded in a surface of the substrate. A capacitor dielectric layer is disposed over the first electrode, and a layer of graphene is disposed over the first electrode in contact with the dielectric layer to contribute a quantum capacitance component to the dielectric layer. An upper electrode is formed on the layer of graphene.

Another plate varactor includes a dielectric substrate and a layer of graphene formed over a portion of a surface of the substrate. A first electrode is formed contacting edges of a periphery of the layer of graphene and over portions of the surface of the substrate. A dielectric layer is formed over the layer of graphene and over a part of the first electrode contacting the layer of graphene. The dielectric layer and the layer of graphene provide a capacitor dielectric wherein the layer of graphene contributes a quantum capacitance component to the dielectric layer. An upper electrode is formed on the dielectric layer.

A method for fabricating a plate varactor includes forming a trench in a dielectric substrate; forming an embedded electrode in the trench of the substrate; forming a capacitor dielectric layer over the first electrode; providing a layer of graphene over the first electrode to contribute a quantum capacitance component to the dielectric layer; and forming an upper electrode on the layer of graphene.

Another method for fabricating a plate varactor includes providing a layer of graphene formed over a portion of a surface of a dielectric substrate; forming a first electrode contacting edges of a periphery of the layer of graphene and over portions of the surface of the substrate; forming a dielectric layer over the layer of graphene and over a part of the first electrode contacting the layer graphene, the dielectric layer and the layer of graphene providing a capacitor dielectric wherein the layer of graphene contributes a quantum capacitance component to the dielectric layer; and forming an upper electrode on the dielectric layer. Other embodiments and methods for fabrication are also included.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
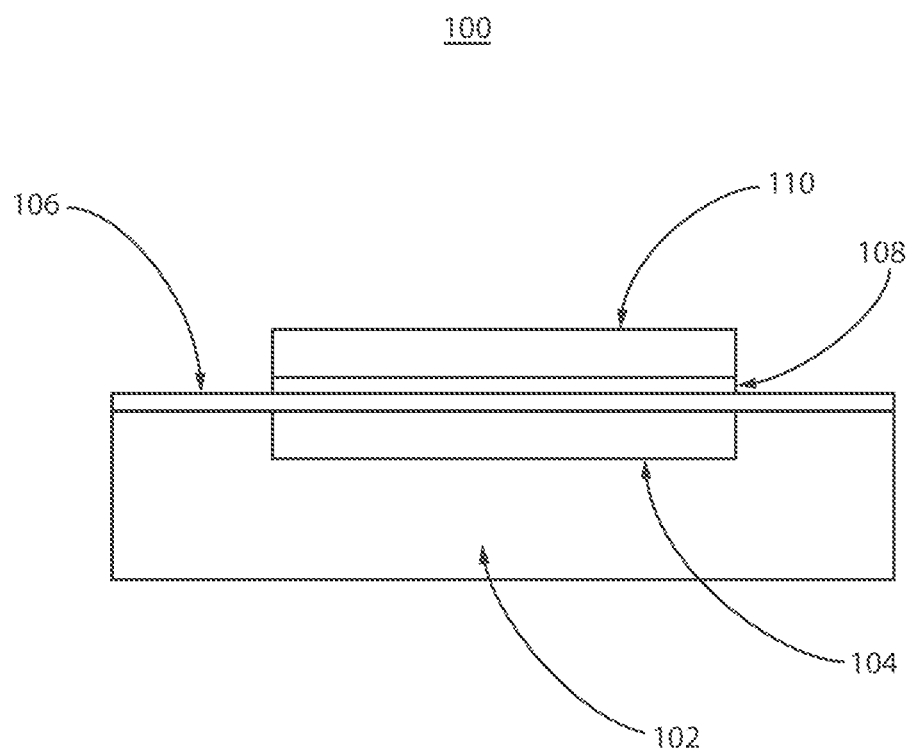
FIG. 1 is a cross-sectional view of a varactor with a capacitor dielectric including graphene enclosed between two electrodes in accordance with one embodiment.

In accordance with the present principles, graphene varactors are provided. The varactors include a layer of graphene disposed between two electrodes. In one embodiment, one of the electrodes may be embedded in a top portion of a substrate. High dielectric constant (high-K) material may be formed over the embedded electrode, with a layer of graphene over the high-K dielectric material. An upper electrode may be formed on the layer of graphene. In this case, both electrodes completely cover the graphene area, minimizing the contact resistance and improving the varactor's quality factor.

In another embodiment, a graphene varactor is formed having a layer of graphene formed over a portion of a surface of the substrate. One electrode is formed to contact edge regions of the graphene and over other portions of the surface of the substrate. A dielectric layer (preferably high-K) is formed over the graphene and the part of the electrode contacting the graphene. An upper electrode is then formed on the dielectric layer.

In accordance with the present principles, plate capacitor type varactors are provided, which preferably include a single layer of graphene between electrodes. No gate or diffusion regions are needed as the present principles do not employ field effect transistor type varactors. The present principles instead provide plate varactors compatible with graphene process technology, which employ quantum capacitance effects of the graphene material to adjust capacitance of the varactor. Such varactors provide improvements needed for future generations of integrated circuits.

It is to be understood that the present invention will be described in terms of a given illustrative architecture having a wafer or substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a varactor 100 is formed on or in a substrate 102 with a graphene sheet 108 on a dielectric 106 between two electrodes 104 and 110. A total capacitance between the two electrodes 104, 110 is a series combination of a dielectric capacitance ($C_{OX}$) of dielectric 106 and a quantum capacitance from graphene ($C_Q$). A voltage difference between the two electrodes 104, 110 produces an electric field across the dielectric 106 and the graphene sheet 108. While $C_{OX}$ is constant, $C_Q$ exhibits a strong dependence on the electric field. Hence, the total capacitance depends on the voltage between the electrodes 104 and 110 and a variable capacitor (varactor 100) is obtained.

It should be understood that the graphene sheet 108 acts, not as a transistor channel but as a capacitor dielectric with a quantum sensitivity to applied voltage. The quantum capacitance is not present in conventional semiconductors such as silicon. Moreover, its value can change by one or two orders of magnitude with moderate voltage control variations (e.g., 1-2 V). For many circuit applications, it is desired that a varactor features a largest possible variation between the maximum and minimum capacitance. For this purpose, in the graphene varactor 100, $C_Q$ should dominate the total varactor capacitance. To accomplish this, $C_{OX}$ should be as large as possible and therefore a high-k dielectric for dielectric 106 is preferably employed. The varactor 100 provides a higher quality dielectric deposition achievable by its embedded electrode structure. Moreover, both electrodes 104 and 110 completely cover the graphene 108, minimizing contact resistance and improving the varactor's quality factor.

Figure 2:
FIG. 2 is a cross-sectional view of a dielectric substrate provided in accordance with one illustrative embodiment.

FIGS. 2-7 show an illustrative method for fabricating the varactor 100 of FIG. 1. Referring to FIG. 2, substrate 102 is provided or formed. Substrate 102 may be formed on another layer or material. In one embodiment, substrate 102 may be formed on a semiconductor material, such as a bulk silicon, GaAs, Ge, SiGe or other substrate, e.g., semiconductor on insulator (SOI). Substrate 102 includes a dielectric material, such as silicon dioxide, silicon carbide or other inorganic or organic dielectric material.

Figure 3:
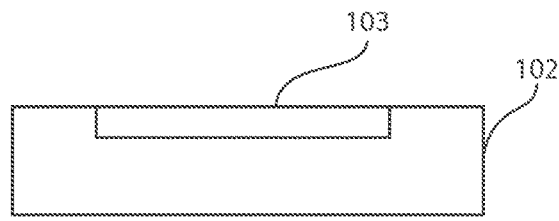
FIG. 3 is a cross-sectional view showing a trench formed in the dielectric substrate of FIG. 2 in accordance with one illustrative embodiment.

Referring to FIG. 3, a trench 103 is etched into the substrate 102. This may include forming a mask and etching the trench 103 by a known etching method, such as, e.g., a reactive ion etch (RIE) method. The mask may be formed by a lithographic process. The trench 103 is formed to enable the formation of an embedded electrode as will be described with respect to FIG. 4.

Figure 4:
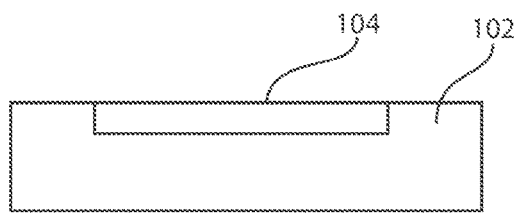
FIG. 4 is a cross-sectional view of an embedded electrode formed in the dielectric substrate of FIG. 3 in accordance with one illustrative embodiment.

Referring to FIG. 4, a conductive material is deposited and processed to form an electrode 104. The conductive material may include a deposited metal, such as copper, aluminum, gold, silver, tungsten, etc. Other conductive material such as doped polysilicon, organic conductors, etc. may also be employed. The conductive material is likely uniformly deposited to fill the trench 103 and cover portions of the substrate 102. To confine the conductive material to the trench 103, a planarizing process such as a chemical mechanical polish (CMP) or an etching process may be employed to form the electrode 104 at or below a surface of the substrate 102.

Figure 5:
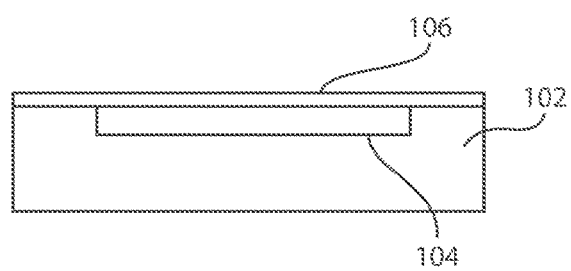
FIG. 5 is a cross-sectional view showing a dielectric layer formed on the embedded electrode of FIG. 4 in accordance with one illustrative embodiment.

Referring to FIG. 5, dielectric 106 is formed over the substrate 102 and the electrode 104. While the dielectric 106 may include a silicon dioxide, silicon carbide, etc., since $C_{OX}$ is desired to be maximized to obtain optimum performance of the varactor 100, a dielectric with a high dielectric constant (e.g., higher than 3.9) is preferred for dielectric 106. Dielectric 106 may include, e.g., hafnium dioxide, hafnium oxynitride, silicon oxynitride, hafnium silicate, zirconium silicate, zirconium dioxide, etc. The high-K dielectric for dielectric 106 may be deposited by, e.g., an atomic layer deposition process. Since electrode 104 is embedded and has a surface even with substrate 102, high-K dielectric deposition is supported, which is generally very difficult to uniformly form on graphene due to its inert surface.

Figure 6:
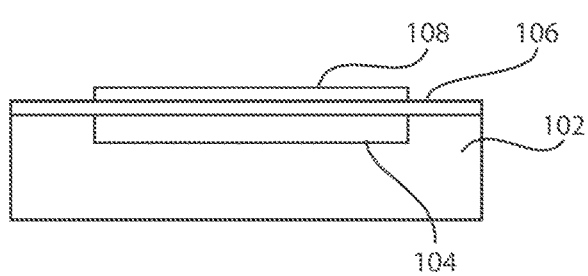
FIG. 6 is a cross-sectional view showing a graphene layer patterned on the dielectric layer of FIG. 5 to correspond to the embedded electrode in accordance with one illustrative embodiment.

Referring to FIG. 6, dielectric 106 is suited for the formation of a graphene material 108 thereon. Graphene material 108 may include a chemical vapor deposited (CVD) layer, an epitaxially grown layer, a solution based deposited layer (dipping), a mechanically exfoliated layer (transferred layer), etc. The process by which graphene is deposited on the dielectric 106 may vary with the material of the dielectric 106, expense and/or other factors. For example, a mechanically exfoliated graphene or CVD grown graphene can be transferred on an oxide. This embodiment provides a flat and even surface on which to form the graphene material 108. Since the dielectric 106 is formed flat, applying the graphene material 108 by a dipping process or a transfer process is enabled. These processes greatly simplify workflow and reduce cost.

The graphene material 108 may be roughly formed in terms of coverage on the dielectric 106 since the graphene may be shaped in a later process. The graphene material 108 may be formed with between about 1 to about 10 or more graphene layers. While additional layers may also be useful, a single layer of graphene material 108 is preferred. The graphene material 108 may be patterned to adjust its shape. A lithographic mask may be formed on the graphene 108, and the graphene material 108 is patterned, for example, by a lithographic development process and etched to form a shaped graphene material 108. The mask (not shown) is then removed to expose the shaped graphene material 108. The graphene material 108 may be formed in any shape. The graphene material 108 in undesirable areas is preferably removed by, e.g., an oxygen plasma based dry etch. Other etching or patterning processes may also be employed.

Figure 7:
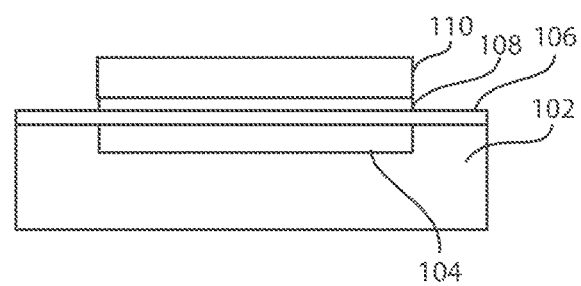
FIG. 7 is a cross-sectional view showing an upper electrode formed over the graphene layer of FIG. 6 and corresponding to the embedded electrode in accordance with one illustrative embodiment.

Referring to FIG. 7, a top electrode 110 is formed on the graphene material 108. Electrode 110 preferably includes a same material as electrode 104 although other materials may be selected. Electrode 110 may be formed by employing a lift-off process. The lift-off process may include forming a sacrificial layer, which is deposited and an inverse pattern is created (e.g., using a photoresist, which is exposed and developed). The inverse pattern includes holes where conductive material for electrode 110 should remain on the graphene material 108. For example, the photoresist is removed in the areas where the electrode 110 is to be located. Conductive material is deposited over the photoresist and exposed graphene material 108. The rest of the sacrificial material (photoresist) is washed out together with parts of the conductive material covering the photoresist. Only the material that was in the holes and having direct contact with the graphene material 108 remains. Other processes such as, e.g., masking and etching a conductive layer may also be employed to form electrode 110. Additional processing may continue, e.g., forming connections to the plate electrodes 104 and 110 of the plate varactor 100, forming additional interlevel dielectrics, etc.

Figure 8:
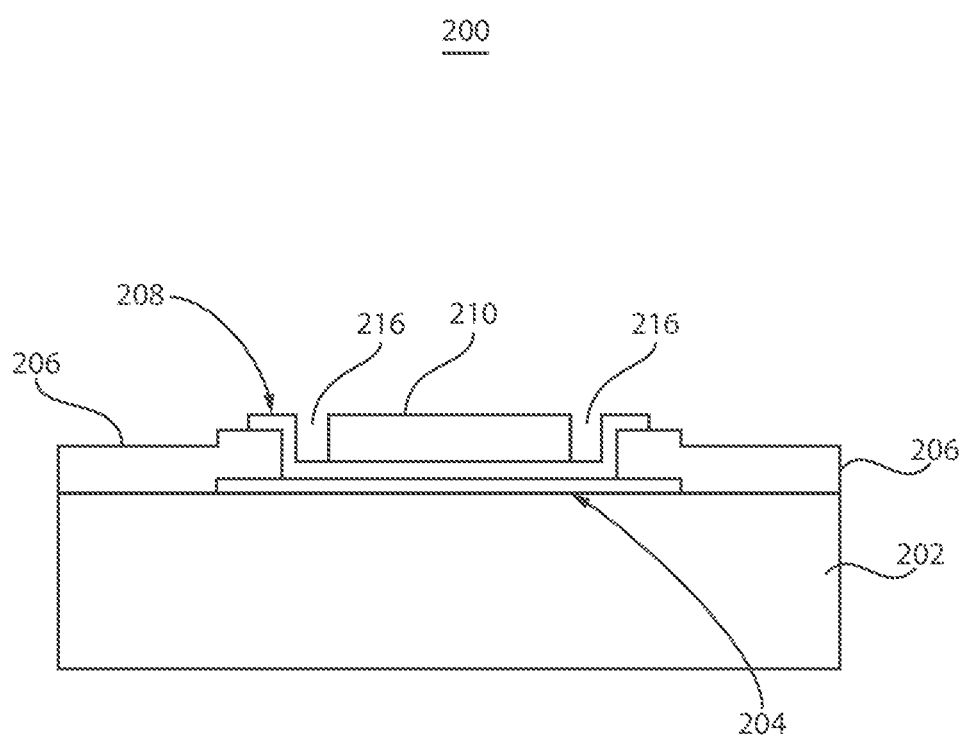
FIG. 8 is a cross-sectional view of a varactor with a capacitor dielectric including graphene sandwiched between two different sized electrodes in accordance with another embodiment.

Referring to FIG. 8, a varactor 200 is formed on a substrate 202 using a graphene sheet 204 covered by a dielectric 208 and having two electrodes 206 and 210. As before, the total capacitance between the two electrodes 206, 210 is a series combination of a dielectric capacitance ($C_{OX}$) and a quantum capacitance from graphene ($C_Q$). A voltage difference between the two electrodes 206, 210 produces an electric field across the dielectric 208 and the graphene sheet 204. While $C_{OX}$ is constant, $C_Q$ exhibits a strong dependence on the electric field. Hence, the total capacitance depends on the voltage between the electrodes 206 and 210 and a variable capacitor (varactor 200) is obtained.

It should be understood that the graphene sheet 204 acts, not as a transistor channel but as a capacitor dielectric with a quantum sensitivity to applied voltage. The quantum capacitance can change by one or two orders of magnitude with moderate voltage control variations (e.g., 1-2 V). In graphene varactor 200, $C_Q$ should dominate the total varactor capacitance by making $C_{OX}$ as large as possible. Therefore, a high-k dielectric for dielectric 208 is preferably employed. Relief zones 216 are optionally provided and will be explained in greater detail below.

Figure 9:
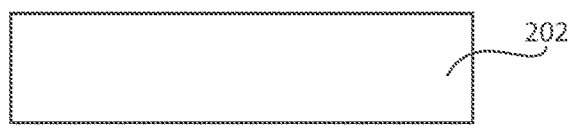
FIG. 9 is a cross-sectional view of a dielectric substrate provided in accordance with one illustrative embodiment.

FIGS. 9-14 show an illustrative method for fabricating the varactor 200 of FIG. 8. Referring to FIG. 9, substrate 202 is provided or formed. Substrate 102 may be formed on another layer or material. In one embodiment, substrate 102 may be formed on a semiconductor material, such as a bulk silicon, GaAs, Ge, SiGe or other substrate, e.g., semiconductor on insulator (SOI). Substrate 102 includes a dielectric material, such as silicon dioxide, silicon carbide or other inorganic or organic dielectric material.

Figure 10:
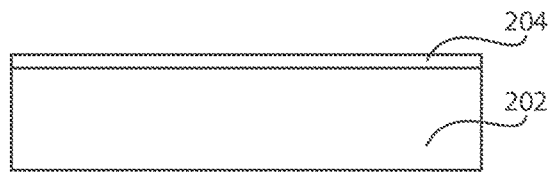
FIG. 10 is a cross-sectional view showing a graphene layer formed on the dielectric substrate of FIG. 9 in accordance with one illustrative embodiment.

Referring to FIG. 10, a graphene material 204 is formed or transferred to a surface of the substrate 202. Graphene material 204 may include a chemical vapor deposited (CVD) layer, an epitaxially grown layer, a solution based deposited layer (dipping), a mechanically exfoliated layer (transferred layer), etc. The process by which graphene is deposited on the substrate 202 may vary with the material of the substrate 202, expense and/or other factors. For example, a mechanically exfoliated graphene or CVD grown graphene can be transferred on an oxide. Alternatively, graphene may be provided on a silicon carbide material. The substrate 202 provides a flat and even surface on which to form the graphene material 204. Since the substrate 202 is flat, applying the graphene material 204 by a dipping process or a transfer process is enabled. The graphene material 204 may be roughly formed in terms of coverage on the substrate 202 since the graphene may be shaped by a patterning process (e.g., lithography) (see FIG. 11). The graphene material 204 may be formed with between 1 to about 10 or more graphene layers. While additional layers may also be useful, a single layer of graphene material 204 is preferred.

Figure 11:
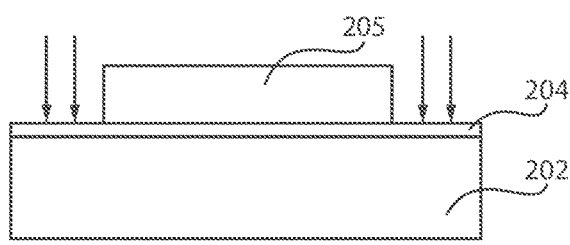
FIG. 11 is a cross-sectional view showing the graphene layer of FIG. 10 being patterned in accordance with one illustrative embodiment.

Referring to FIG. 11, the graphene material 204 may be patterned to adjust its shape. A lithographic mask (e.g., a photoresist) 205 may be formed on the graphene material 204, patterned, for example, by a lithographic development process. The graphene is etched to form a shaped graphene material 204. The mask 205 is then removed to expose the shaped graphene material 204. The graphene material 204 may be formed in any shape. The graphene material 204 in undesirable areas is preferably removed by, e.g., an oxygen plasma based dry etch. Other etching or patterning processes may also be employed.

Figure 12:
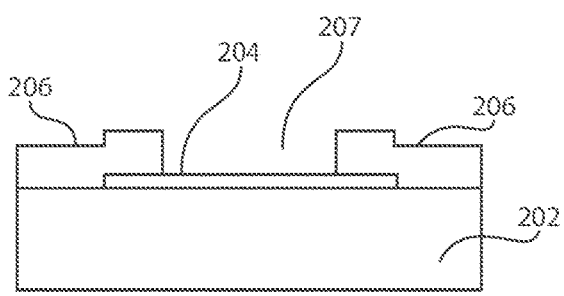
FIG. 12 is a cross-sectional view showing a first electrode formed over a peripheral region (edges) of the graphene layer of FIG. 11 in accordance with one illustrative embodiment.

Referring to FIG. 12, a conductive material is deposited and processed to form an electrode 206. The conductive material may include a deposited metal, such as copper, aluminum, gold, silver, tungsten, etc. Other conductive material such as doped polysilicon, organic conductors, etc. may also be employed. The conductive material may be uniformly deposited over the graphene 204 and portions of the substrate 202. A lithography process may be employed to etch away portions of the conductive layer to expose a portion of the graphene 204. The electrode 206 is formed over the edges or periphery of the graphene 204 with sufficient coverage area to provide adequate resistance when the varactor 200 is completed.

In another embodiment, a lift-off process may be employed to form electrode 206. A sacrificial material (not shown), such as a photoresist may be formed and patterned to occupy a portion of the graphene 204 surface. The conductive material is deposited over the substrate, exposed portions of the graphene 204 and the sacrificial material. Then, the lift-off process breaks down the sacrificial material to leave the structure depicted in FIG. 12. Other methods may be employed to form the electrode 206.

Figure 13:
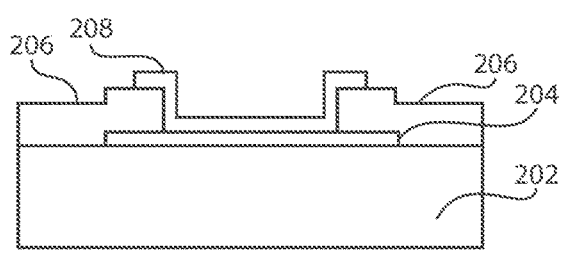
FIG. 13 is a cross-sectional view showing a dielectric layer formed and patterned on the first electrode of FIG. 12 in accordance with one illustrative embodiment.

Referring to FIG. 13, a dielectric 208 is formed over the graphene 204, the electrode 206 and the substrate 202. While the dielectric 208 may include a silicon dioxide, silicon carbide, etc., since Cox is desired to be maximized to obtain optimum performance of the varactor 200, a dielectric with a high dielectric constant (e.g., higher than 3.9) is preferred for dielectric 208. Dielectric 208 may include, e.g., hafnium dioxide, hafnium oxynitride, silicon oxynitride, hafnium silicate, zirconium silicate, zirconium dioxide, etc. The high-K dielectric for dielectric 208 may be deposited by, e.g., an atomic layer deposition process. The dielectric 208 is patterned to remove the dielectric 208 from larger portion of the electrode 206. The dielectric 208 may be patterned using a lithography process to form a mask and etch with a wet etch or RIE process.

Figure 14:
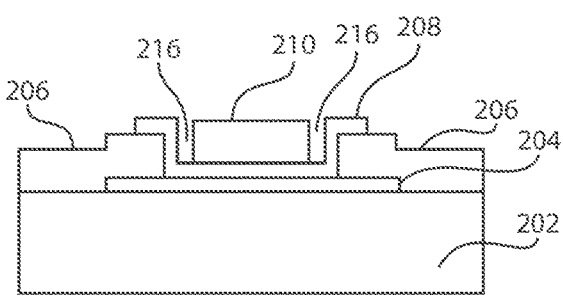
FIG. 14 is a cross-sectional view showing an upper electrode formed on the dielectric layer and over the graphene layer of FIG. 13 in accordance with one illustrative embodiment.

Referring to FIG. 14, a top electrode 210 is formed on the dielectric 208. Electrode 210 preferably includes a same material as electrode 206 although other materials may be selected. Electrode 210 may be formed by employing a lift-off process. The lift-off process may include forming a sacrificial layer, which is deposited and an inverse pattern is created (e.g., using a photoresist, which is exposed and developed). The inverse pattern includes holes where conductive material for electrode 210 should remain on the dielectric material 208. For example, the photoresist is removed in the areas where the electrode 210 is to be located. Conductive material is deposited over the photoresist, exposed dielectric 208, electrode 206 and other areas. The rest of the sacrificial material (photoresist) is washed out together with parts of the conductive material covering the photoresist. Only the material that was in the holes and having direct contact with the dielectric 208 remains. Other processes such as, e.g., masking and etching a conductive layer may also be employed to form electrode 210. The formation process for electrode 210 may provide relief zones 216 at a periphery of the electrode 210 such that contact with the dielectric 208 on vertical surfaces is limited. This assists in maintaining the plate capacitor area without including the vertical surfaces. In some embodiments, the electrode 210 may fill the relief zones 216. Additional processing may continue, e.g., forming connections to the plate electrodes 206 and 210 of the plate varactor 200, forming additional interlevel dielectrics, etc.

Figure 15:
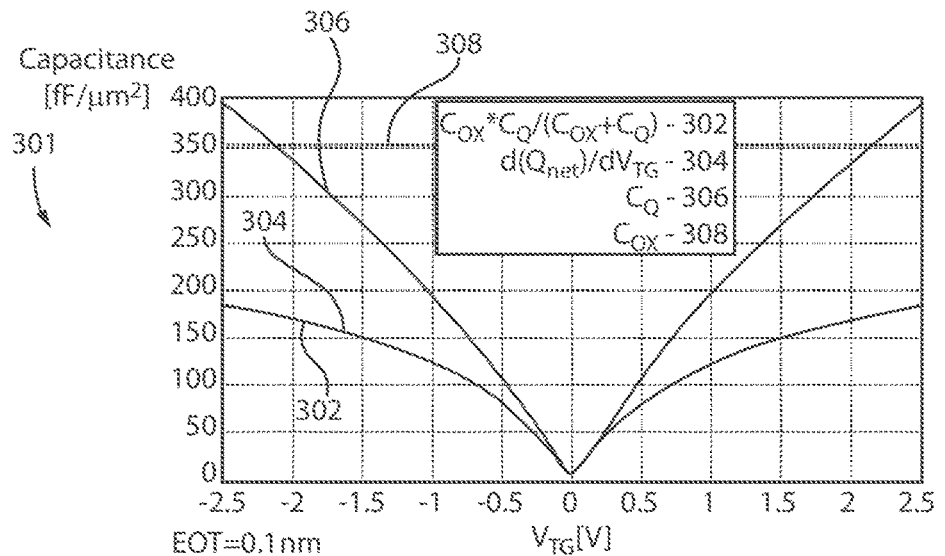
FIG. 15 shows three plots of capacitance versus applied voltage to show the tunability of varactors in accordance with the present principles.
Figure 15:
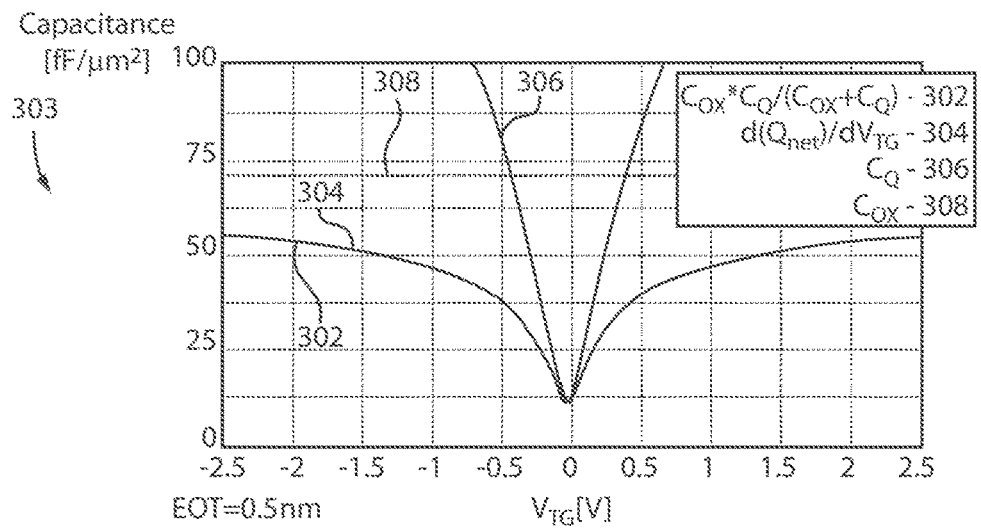
Figure 15:
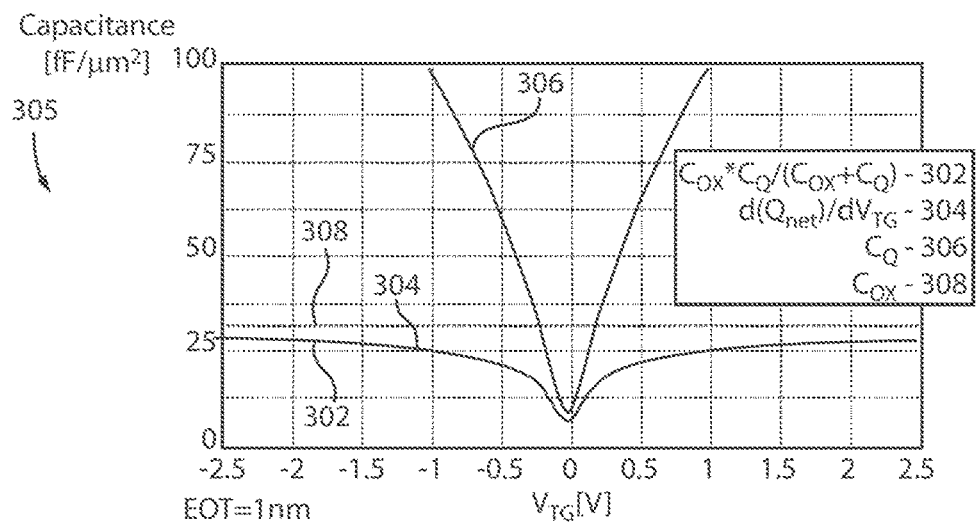

Referring to FIG. 15, shows three simulation plots 301, 303 and 305 of capacitance (in fF/micron$^2$) versus $V_{TG}$ (in volts) applied to electrodes separated by a dielectric layer and graphene for varactors in accordance with the present principles. The three plots 301, 303 and 305 have different equivalent oxide thicknesses (EOT). These include EOT=0.1 nm for plot 301, EOT=0.5 nm for plot 303, and EOT=1.0 nm for plot 305.

The plots 301, 303, 305 show total capacitance 302 (as: $C_{OX}*C_Q/(C_{OX}+C_Q)$) and total capacitance 304 (as: $d(Q_{net})/dV_{TG}$, which is the derivative of the net charge with respect to $V_{TG}$). The total capacitances 302 and 304 coincide in the plots 301, 303, 305. The plots 301, 303, 305 further show $C_{OX}$ 308 and $C_Q$ 306.

The plots 301, 303, 305 show a large (>10) capacitance tunability through graphene quantum capacitance ($C_Q$). In fact, greater than 10 times tunability (e.g., $C_{max}/C_{min}$) is provided with $V_{TG}$<1 V. Graphene dielectric capacitors may have many applications including in RF circuits (without the need for Si hybrid technology) and other devices in accordance with the present principles. The present principles provide easy process flow, higher tunability and better performance than conventional counterparts. In particularly useful embodiments, the varactors in accordance with the present principles may be used in or with high performance RF/mmWave graphene ICs.

Figure 16:
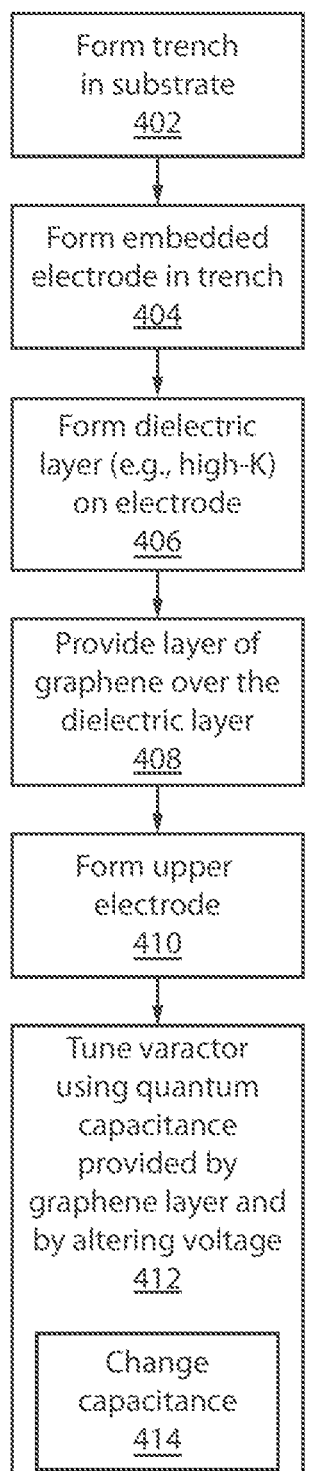
FIG. 16 is a block/flow diagram showing steps for fabricating a varactor of FIG. 1 in accordance with illustrative embodiments.

Referring to FIG. 16, a method for fabricating a plate varactor is described in accordance with particularly useful embodiments. In block 402, a trench is formed in a dielectric substrate. In block 404, an embedded electrode is formed in the trench of the substrate. This may include depositing a conductive material followed by a planarization process to complete the embedded electrode. In block 406, a capacitor dielectric layer is formed over the first electrode. The dielectric layer preferably includes a high dielectric constant material (high-K dielectric). High-K materials are more easily formed over a planarized or flat surface. In block 408, a layer of graphene is provided over the dielectric layer to contribute a quantum capacitance component to the dielectric layer. The layer of graphene may include providing a single layer of graphene. The layer of graphene may be formed by dip coating, transferring, depositing, etc. The layer of graphene preferably is formed to the same extents as the embedded electrode. It should be noted that the dielectric layer and the layer of graphene may be formed in reverse order with the dielectric layer being formed on the graphene layer.

In block 410, an upper electrode is formed on the layer of graphene. This may include patterning the upper electrode to cover lateral extents of the layer of graphene. In this way, the graphene layer is completely sandwiched by the embedded and upper electrodes. In block 412, the quantum capacitance component of the layer of graphene may be tuned by altering an applied voltage to one of the embedded electrode and the upper electrode. In block 414, the tuning may include a change in capacitance of greater than a factor of ten for a one volt change in the applied voltage to either the embedded electrode or the upper electrode.

Figure 17:
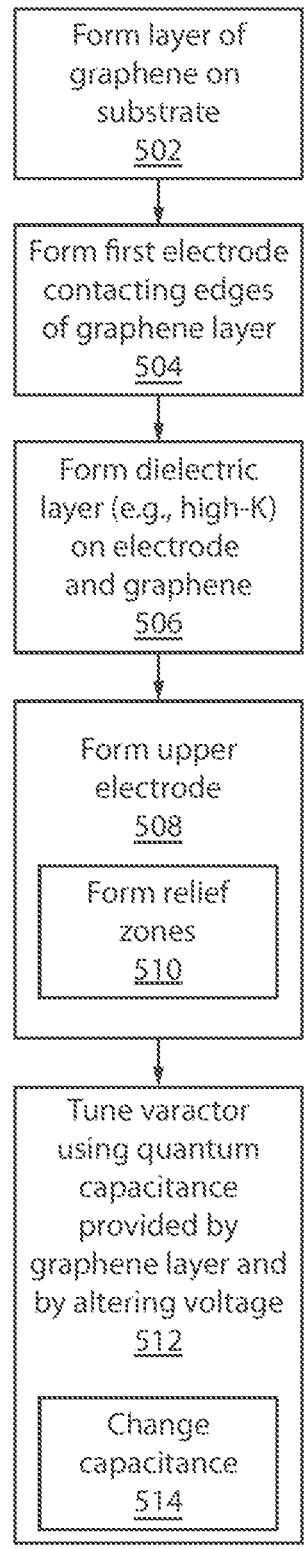
FIG. 17 is a block/flow diagram showing steps for fabricating a varactor of FIG. 8 in accordance with illustrative embodiments.

Referring to FIG. 17, a method for fabricating a plate varactor is described in accordance with other useful embodiments. In block 502, a layer of graphene is formed over a portion of a surface of a dielectric substrate. The graphene may include a single layer. In block 504, a first electrode is formed contacting edges of a periphery of the layer of graphene and over portions of the surface of the substrate. The electrode may be formed using lithography and etching processes, lift-off processes, etc. In block 506, a dielectric layer is formed over the layer of graphene and over a part of the first electrode contacting the layer graphene. The dielectric layer and the layer of graphene provide a capacitor dielectric wherein the layer of graphene contributes a quantum capacitance component to the dielectric layer. The dielectric layer preferably includes a high-K dielectric. The high-K dielectric is deposited and patterned over the first electrode. In block 508, an upper electrode is formed on the dielectric layer. In block 510, relief zones may be provided adjacent to the upper electrode to prevent vertical sides of the upper electrode from contacting the dielectric layer. In block 512, the quantum capacitance component of the layer of graphene may be tuned by altering an applied voltage to one of the first electrode and the upper electrode. In block 514, the tuning may include a change in capacitance of greater than a factor of ten for a one volt change in the applied voltage to either the first electrode or the upper electrode.

Having described preferred embodiments for quantum capacitance graphene varactors and fabrication methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a plate varactor, comprising:
   providing a layer of graphene formed over a portion of a surface of a dielectric substrate;
   forming a first electrode contacting edges of a periphery of the layer of graphene and over portions of the surface of the substrate;
   forming a dielectric layer over the layer of graphene and over a part of the first electrode contacting the layer of graphene, the dielectric layer and the layer of graphene providing a capacitor dielectric, wherein the layer of graphene contributes a quantum capacitance component to the dielectric layer, wherein the quantum capacitance component is tunable with a gain of at least an order of magnitude for an applied voltage between the first electrode and the upper electrode; and
   forming an upper electrode on the dielectric layer.

2. The method as recited in claim 1, wherein forming the dielectric layer includes forming a high-K dielectric over the first electrode and patterning the high-K dielectric.

3. The method as recited in claim 1, wherein forming the upper electrode includes forming relief zones adjacent to the upper electrode to prevent vertical sides of the upper electrode from contacting the dielectric layer.

4. The method as recited in claim 1, further comprising tuning the quantum capacitance component of the layer of graphene by altering an applied voltage to one of the first electrode and the upper electrode.

5. The method as recited in claim 4, wherein the tuning includes a change in capacitance of at least an order of magnitude for a one volt change in the applied voltage to one of the first electrode and the upper electrode.

6. The method as recited in claim 1, wherein providing a layer of graphene includes providing a single layer of graphene.

7. The method as recited in claim 6, wherein the capacitor dielectric includes a high-K dielectric.

8. A method for fabricating a plate varactor, comprising:
   providing a layer of graphene formed over a portion of a surface of a dielectric substrate;
   forming a first electrode contacting edges of a periphery of the layer of graphene and over portions of the surface of the substrate;
   forming a dielectric layer over the layer of graphene and over a part of the first electrode contacting the layer of graphene, the dielectric layer and the layer of graphene providing a capacitor dielectric wherein the layer of graphene contributes a quantum capacitance component to the dielectric layer, wherein the quantum capacitance component is tunable with a gain of at least an order of magnitude for an applied voltage between the first electrode and the upper electrode, wherein forming the dielectric layer includes forming a high-K dielectric over the first electrode and patterning the high-K dielectric; and
   forming an upper electrode on the dielectric layer.

9. The method as recited in claim 8, wherein forming the upper electrode includes forming relief zones adjacent to the upper electrode to prevent vertical sides of the upper electrode from contacting the dielectric layer.

10. The method as recited in claim 8, wherein providing a layer of graphene includes providing a single layer of graphene.

11. The method as recited in claim 8, further comprising tuning the quantum capacitance component of the layer of graphene by altering an applied voltage to one of the first electrode and the upper electrode.

12. The method as recited in claim 11, wherein the tuning includes a change in capacitance of at least an order of magnitude for a one volt change in the applied voltage to one of the first electrode and the upper electrode.

13. A method for fabricating a plate varactor, comprising:
   providing a single layer of graphene formed over a portion of a surface of a dielectric substrate;
   forming a first electrode contacting edges of a periphery of the layer of graphene and over portions of the surface of the substrate;
   forming a dielectric layer over the layer of graphene and over a part of the first electrode contacting the layer of graphene, the dielectric layer and the layer of graphene providing a capacitor dielectric wherein the layer of graphene contributes a quantum capacitance component to the dielectric layer, wherein the quantum capacitance component is tunable with a gain of at least an order of magnitude for an applied voltage between the first electrode and the upper electrode;
   forming an upper electrode on the dielectric layer; and
   forming relief zones adjacent to the upper electrode to prevent vertical sides of the upper electrode from contacting the dielectric layer.

14. The method as recited in claim 13, wherein forming the dielectric layer includes forming a high-K dielectric over the first electrode and patterning the high-K dielectric.

15. The method as recited in claim 13, wherein the upper electrode is the same conductive material as the first electrode.

16. The method as recited in claim 13, further comprising tuning the quantum capacitance component of the layer of graphene by altering an applied voltage to one of the first electrode and the upper electrode.

17. The method as recited in claim 16, wherein the tuning includes a change in capacitance of at least an order of magnitude for a one volt change in the applied voltage to one of the first electrode and the upper electrode.

\* \* \* \* \*